US012235288B2

(12) United States Patent
Nakayama

(10) Patent No.: US 12,235,288 B2
(45) Date of Patent: Feb. 25, 2025

(54) MEASUREMENT DEVICE FOR MEASURING A WAVEFORM AND MEASUREMENT METHOD THEREOF

(71) Applicants: YOKOGAWA ELECTRIC CORPORATION, Tokyo (JP); Yokogawa Test & Measurement Corporation, Tokyo (JP)

(72) Inventor: Etsuro Nakayama, Hachiouji (JP)

(73) Assignees: YOKOGAWA ELECTRIC CORPORATION, Tokyo (JP); Yokogawa Test & Measurement Corporation, Tokyo (JP)

(*) Notice: Subject to any disclaimer, the term of this patent is extended or adjusted under 35 U.S.C. 154(b) by 395 days.

(21) Appl. No.: 17/648,893

(22) Filed: Jan. 25, 2022

(65) Prior Publication Data

US 2023/0047259 A1 Feb. 16, 2023

(30) Foreign Application Priority Data

Aug. 16, 2021 (JP) ................................. 2021-132435

(51) Int. Cl.
*G01R 13/02* (2006.01)
(52) U.S. Cl.
CPC .................................... *G01R 13/02* (2013.01)
(58) Field of Classification Search
CPC ..................................................... G01R 13/02
See application file for complete search history.

(56) References Cited

U.S. PATENT DOCUMENTS

| | | | | |
|---|---|---|---|---|
| 11,487,401 B2* | 11/2022 | Tustin | ................ | G06F 3/0483 |
| 2010/0060496 A1 | 3/2010 | Madisetti et al. | | |
| 2020/0064386 A1* | 2/2020 | Draving | ................ | G01R 19/02 |

FOREIGN PATENT DOCUMENTS

| | | |
|---|---|---|
| JP | S6366633 A | 3/1988 |
| JP | H05256876 A | 10/1993 |
| JP | 2002062316 A | 2/2002 |

OTHER PUBLICATIONS

Nakayama et al., "Real-time Math Function of DL850 ScopeCorder", Yokogawa Electric Corporation, Yokogawa Technical Report, 2012, vol. 55, No. 1, pp. 9-14, total 12 pages; Cited in Specification.

* cited by examiner

*Primary Examiner* — Walter L Lindsay, Jr.
*Assistant Examiner* — Milton Gonzalez
(74) *Attorney, Agent, or Firm* — RANKIN, HILL & CLARK LLP

(57) ABSTRACT

A measurement device (10) includes a first processor (12a) that performs first pipeline processing on a first input signal according to a first sample timing, a second processor (12b) that performs second pipeline processing on a second input signal according to a second sample timing with a sampling period longer than the first sample timing, an adjustment unit that adjusts an output timing of the first input signal on which the first pipeline processing was performed to match an output timing of the second input signal on which the second pipeline processing was performed, and a creation unit (17) that sequentially creates a waveform of the first input signal on which the first pipeline processing was performed and for which the output timing was adjusted by the adjustment unit, and a waveform of the second input signal on which the second pipeline processing was performed.

8 Claims, 11 Drawing Sheets

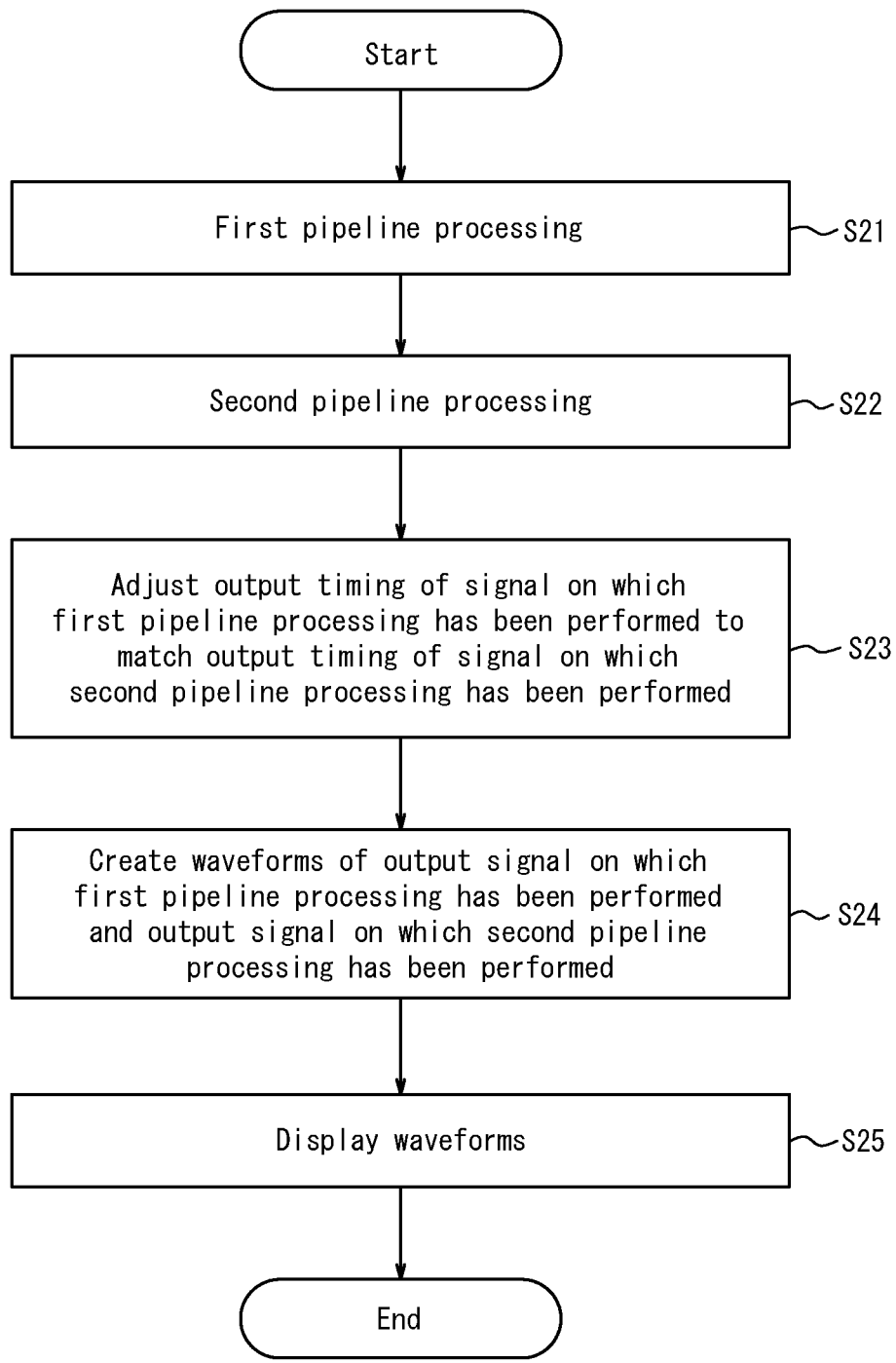

MEASUREMENT DEVICE FOR MEASURING A WAVEFORM AND MEASUREMENT METHOD THEREOF

CROSS-REFERENCE TO RELATED APPLICATION

The present application claims priority to Japanese Patent Application No. 2021-132435 filed on Aug. 16, 2021, the entire contents of which are incorporated herein by reference.

TECHNICAL FIELD

The present disclosure relates to a measurement device and a measurement method.

BACKGROUND

Measurement devices that receive input of various physical quantities as electric signals and measure the waveform of the electric signals in real time are known. Such measuring instruments generally receive input of electric signals as analog signals and perform various types of signal processing, including Analog-to-Digital (A/D) conversion processing, on the input signals. Some of these measurement devices are known to include a plurality of modules that each perform signal processing on the input signals, and these measurement devices are capable of measuring and comparing the waveforms of a plurality of input signals in real time (Non-patent Literature 1).

CITATION LIST

Non-Patent Literature

NPL 1: Etsurou Nakayama, Chiaki Yamamoto, "Real-time Math Function of DL850 ScopeCorder", Yokogawa Electric Corporation, Yokogawa Technical Report, 2012, Vol. 55, No. 1, pp. 9-14

SUMMARY

A measurement device according to an embodiment is a measurement device for measuring a waveform of an input signal, the measurement device including:
  a first processor configured to perform first pipeline processing on a first input signal according to a first sample timing;
  a second processor configured to perform second pipeline processing on a second input signal according to a second sample timing that has a sampling period longer than the first sample timing;
  an adjustment unit configured to adjust an output timing of the first input signal on which the first pipeline processing has been performed by the first processor to match an output timing of the second input signal on which the second pipeline processing has been performed by the second processor; and
  a creation unit configured to sequentially create a waveform of the first input signal on which the first pipeline processing has been performed and for which the output timing has been adjusted by the adjustment unit, and a waveform of the second input signal on which the second pipeline processing has been performed.

A measurement method according to an embodiment is a measurement method of a measurement device for measuring a waveform of an input signal, the measurement method comprising:
  performing, by a first processor, first pipeline processing on a first input signal according to a first sample timing;
  performing, by a second processor, second pipeline processing on a second input signal according to a second sample timing that has a sampling period longer than the first sample timing;
  adjusting, by an adjustment unit, an output timing of the first input signal on which the first pipeline processing has been performed by the first processor to match an output timing of the second input signal on which the second pipeline processing has been performed by the second processor; and
  sequentially creating, by a creation unit, a waveform of the first input signal on which the first pipeline processing has been performed and for which the output timing has been adjusted by the adjustment unit, and a waveform of the second input signal on which the second pipeline processing has been performed.

BRIEF DESCRIPTION OF THE DRAWINGS

In the accompanying drawings:

FIG. 10 is a flowchart illustrating processing procedures of a measurement device according to the present disclosure.

DETAILED DESCRIPTION

Figure 1:
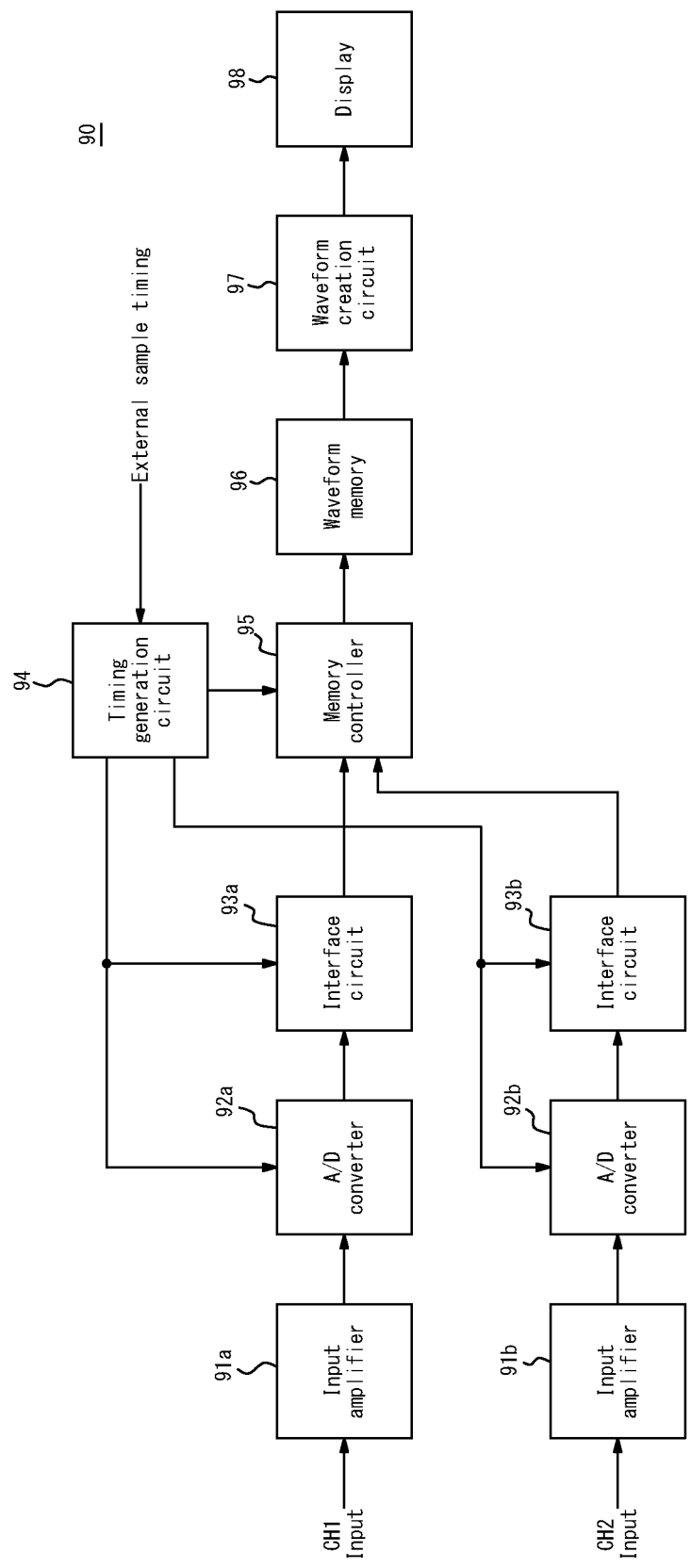
FIG. 1 is a block diagram schematically illustrating a configuration of a measurement device according to a comparative example.

Consider a measurement device that includes a plurality of modules that each receive input, from an external source, of a common sampling signal defining a sample timing and perform various types of signal processing, such as A/D conversion, in synchronization with the sample timing indicated by the sampling signal. Here, assume that the maximum sampling rate (frequency) supported by each module is different. In such a measurement device, if the sampling rate of the inputted sampling signal exceeds the maximum sampling rate of a portion of the modules, the signal processing by that portion of the modules is delayed more than that of the other modules. Therefore, a shift in the timing at which the signal processing is completed occurs between the modules for which the sampling rate of the sampling signal exceeds the maximum sampling rate and the other modules. When various signal processing is performed in each module by pipeline processing, the shift in time required for each process that constitutes the pipeline accumulates, resulting in a larger time shift in the output signals of the modules overall.

Therefore, when the sampling rate of the sampling signal exceeds the maximum sampling rate of a portion of the modules in a known configuration, i.e., when the sampling period of the sampling signal is shorter than the maximum sampling period of a portion of the modules, the waveforms of the output signals of the modules cannot be correctly compared in real time. In particular, when the sampling rate of the sampling signal varies with time, the shift in the time required for signal processing in each module also varies, making it even more difficult in a known configuration to align the times of the output signals of the modules and compare the output signals in real time.

It would be helpful to provide a measurement device and a measurement method that, in a configuration including a plurality of modules having different maximum sampling rates, can compare the waveforms of output signals of the modules in real time.

A measurement device according to an embodiment is a measurement device for measuring a waveform of an input signal, the measurement device including a first processor configured to perform first pipeline processing on a first input signal according to a first sample timing, a second processor configured to perform second pipeline processing on a second input signal according to a second sample timing that has a sampling period longer than the first sample timing, an adjustment unit configured to adjust an output timing of the first input signal on which the first pipeline processing has been performed by the first processor to match an output timing of the second input signal on which the second pipeline processing has been performed by the second processor, and a creation unit configured to sequentially create a waveform of the first input signal on which the first pipeline processing has been performed and for which the output timing has been adjusted by the adjustment unit, and a waveform of the second input signal on which the second pipeline processing has been performed. In this way, the measurement device can adjust the output timing of the first input signal on which the first pipeline processing has been performed by the first processor to match the output timing of the second input signal on which the second pipeline processing has been performed by the second processor. Therefore, the waveforms of the output signals of the modules can be compared in real time, even if the maximum sampling rate (maximum sampling period) differs between the first processor and the second processor.

In an embodiment, the measurement device further includes a memory configured to store the first input signal on which the first pipeline processing has been performed, and the second input signal on which the second pipeline processing has been performed. The adjustment unit includes a storage configured to sequentially store the first input signal on which the first pipeline processing has been performed by the first processor according to the first sample timing, a counter configured to count the number of times the first sample timing occurs during a period of the second sample timing, and a controller configured to, according to the second sample timing, sequentially read the first input signal, on which the first pipeline processing has been performed, from the storage the number of times counted by the counter and store each first input signal in the memory, and store the second input signal, on which the second pipeline processing has been performed, in the memory the number of times counted by the counter. The creation unit sequentially creates the waveform of the first input signal and the waveform of the second input signal that are stored in the memory. In this way, with the storage that sequentially stores the first input signal on which the first pipeline processing has been performed according to the first sample timing, the adjustment unit adjusts the timing for writing the first input signal, on which the first pipeline processing has been performed, to the memory to match the second pipeline processing. Furthermore, the adjustment unit counts the number of times the first sample timing occurs during the period of the second sample timing and repeats the process of storing the second input signal, on which the second pipeline processing has been performed, in the memory the number of times counted by the counter. Therefore, since the time shift between the first input signal and the second input signal and the difference in the number of samples are eliminated, the waveforms of the output signals of the modules can be compared in real time.

In an embodiment, the storage includes a FIFO function. Therefore, the first input signal on which the first pipeline processing has been performed can be stored while maintaining the temporal order.

In an embodiment, the measurement device further includes a memory configured to store the first input signal on which the first pipeline processing has been performed, and the second input signal on which the second pipeline processing has been performed. The first input signal on which the first pipeline processing has been performed by the first processor according to the first sample timing is sequentially stored in the memory. The adjustment unit includes a counter configured to count the number of times the first sample timing occurs during a period of the second sample timing, and a controller configured to, according to the second sample timing, store the second input signal, on which the second pipeline processing has been performed, in the memory the number of times counted by the counter. The creation unit reads the first input signal on which the first pipeline processing has been performed from the memory after delaying by the number of times the first sample timing occurs. In response to storage, in the memory, of the second input signal on which the second pipeline processing has been performed, the creation unit reads the second input signal on which the second pipeline processing has been performed from the memory. The creation unit sequentially creates the waveform of the first input signal read from the memory and the waveform of the second input signal read from the memory. In this way, the adjustment unit counts the number of times the first sample timing occurs during the period of the second sample timing and repeats the process of storing the second input signal, on which the second pipeline processing has been performed, in the memory the number of times counted by the counter. Furthermore, the creation unit delays the processing to read the first input signal on which the first pipeline processing has been performed from the memory to match the second pipeline processing. Therefore, since the time shift between the first input signal and the second input signal and the difference in the number of samples are eliminated, the waveforms of the output signals of the modules can be compared in real time.

In an embodiment, the measurement device further includes a timing generator configured to generate a first timing signal indicating the first sample timing and a second timing signal indicating the second sample timing based on a sampling signal indicating a sample timing inputted from an external source, output the first timing signal to the first processor, and output the second timing signal to the second processor. The first processor performs the first pipeline processing according to the first sample timing indicated by the first timing signal inputted from the timing generator, and the second processor performs the second pipeline processing according to the second sample timing indicated by the second timing signal inputted from the timing generator. In this way, the first and second timing signals are generated based on the sampling signal indicating the sample timing inputted from an external source. Processing can thereby proceed in real time in synchronization with the sampling signal from the external source.

In an embodiment, in a case in which a sampling period of the sample timing inputted from the external source is shorter than a maximum sampling period supported by the second processor, the timing generator generates the second timing signal so that the second timing signal indicates a sample timing of the maximum sampling period as the second sample timing. In this way, in a case in which the sampling period of the sample timing inputted from an external source is shorter than the maximum sampling period of the second processor, the maximum sampling period is used as the second sample timing. Processing can thereby proceed in accordance with the performance of the second processor.

In an embodiment, A/D conversion processing is included in the first pipeline processing and the second pipeline processing. Therefore, the waveforms of the output signals of the modules can be compared in real time, even if the processing speeds of the A/D conversion processing included in the measurement device are different.

A measurement method according to an embodiment is a measurement method of a measurement device for measuring a waveform of an input signal, the measurement method including performing, by a first processor, first pipeline processing on a first input signal according to a first sample timing, performing, by a second processor, second pipeline processing on a second input signal according to a second sample timing that has a sampling period longer than the first sample timing, adjusting, by an adjustment unit, an output timing of the first input signal on which the first pipeline processing has been performed by the first processor to match an output timing of the second input signal on which the second pipeline processing has been performed by the second processor, and sequentially creating, by a creation unit, a waveform of the first input signal on which the first pipeline processing has been performed and for which the output timing has been adjusted by the adjustment unit, and a waveform of the second input signal on which the second pipeline processing has been performed. In this way, the measurement method of a measurement device can adjust the output timing of the first input signal on which the first pipeline processing has been performed by the first processor to match the output timing of the second input signal on which the second pipeline processing has been performed by the second processor. Therefore, the waveforms of the output signals of the modules can be compared in real time, even if the maximum sampling rate (maximum sampling period) differs between the first processor and the second processor.

According to an embodiment of the present disclosure, in a configuration including a plurality of modules having different maximum sampling rates, the waveforms of output signals of the modules can be compared in real time.

Comparative Example

A measurement device 90 includes a plurality of modules, which each perform signal processing on input signals, and measures the waveforms of a plurality of input signals in real time. The modules each include an input terminal for input, from an external source, of a common sampling signal defining a sample timing and capture data in synchronization with the sample timing indicated by the sampling signal. The maximum sampling rate (maximum sampling period) supported by each module of the measurement device 90 is different.

One example of sampling with a sampling signal from an external source is the case in which an encoder that outputs a signal in response to rotation by a predetermined rotation angle is attached to a rotating body, and data is captured as the rotating body rotates based on the signal from the encoder. By sampling according to the rotation angle of the rotating body in this way, the behavior of the measurement target can be accurately recorded at each predetermined rotation angle of the rotating body, and effective data for analysis of the rotating body can be obtained.

A user can freely combine a plurality of input modules having different maximum sampling rates (frequencies) and mount the input modules on a measurement device 90. In general, there exists a trade-off relationship, in the A/D converter (converter) used in the input module, between the resolution of A/D conversion (resolution of a digital signal) and the sampling rate of A/D conversion (temporal resolution) for the same circuit scale. An A/D converter with a larger number of resolution bits has a lower maximum conversion sampling rate than an A/D converter with a smaller number of resolution bits. The user determines the input module by selecting whether to give priority to the resolution of A/D conversion or the sampling rate, according to the characteristics of the signal to be observed and the application.

FIG. 1 is a block diagram schematically illustrating a configuration of the measurement device 90 according to the comparative example. The measurement device 90 includes input amplifiers 91 (91a, 91b), A/D converters 92 (92a, 92b), interface circuits 93 (93a, 93b), a timing generation circuit 94, a memory controller 95, a waveform memory 96, a waveform creation circuit 97, and a display 98. The measurement device 90 receives input of an input signal in analog form from each of channel (CH) 1 and CH 2, converts the input signals into digital signals in the input circuit for each channel, and displays the digital signals on the display 98. The input amplifier 91a, the A/D converter 92a, and the interface circuit 93a function as an input circuit (input module) that performs A/D conversion on the signal of CH 1. The input amplifier 91b, the A/D converter 92b, and the interface circuit 93b function as an input circuit that performs A/D conversion on the signal of CH 2. The A/D converter 92a for CH 1 has a low A/D conversion resolution, but can perform high-speed A/D conversion. The A/D converter 92b for CH 2 has a higher A/D conversion resolution than the A/D converter 92a, but the A/D conversion is low-speed.

The input amplifiers 91 (91a, 91b) receive an analog electric signal corresponding to a physical quantity as an input signal and amplify the input signal in accordance with the standard of the A/D converters 92 (92a, 92b). The analog signal of CH 1 that is to be observed is normalized by the input amplifier 91a and outputted to the A/D converter 92a. At the same time, the analog signal of CH 2 that is to be observed is normalized by the input amplifier 91b and outputted to the A/D converter 92b.

The timing for capturing data is inputted to the timing generation circuit 94 as a sample timing from an external source. The timing generation circuit 94 outputs the sample timing as a timing signal indicating the conversion timing for the A/D converters 92 (92a, 92b) after decimating the sample timing appropriately so that the maximum sampling rate of the A/D converter 92 (92a, 92b) for each channel is not exceeded.

Figure 2:
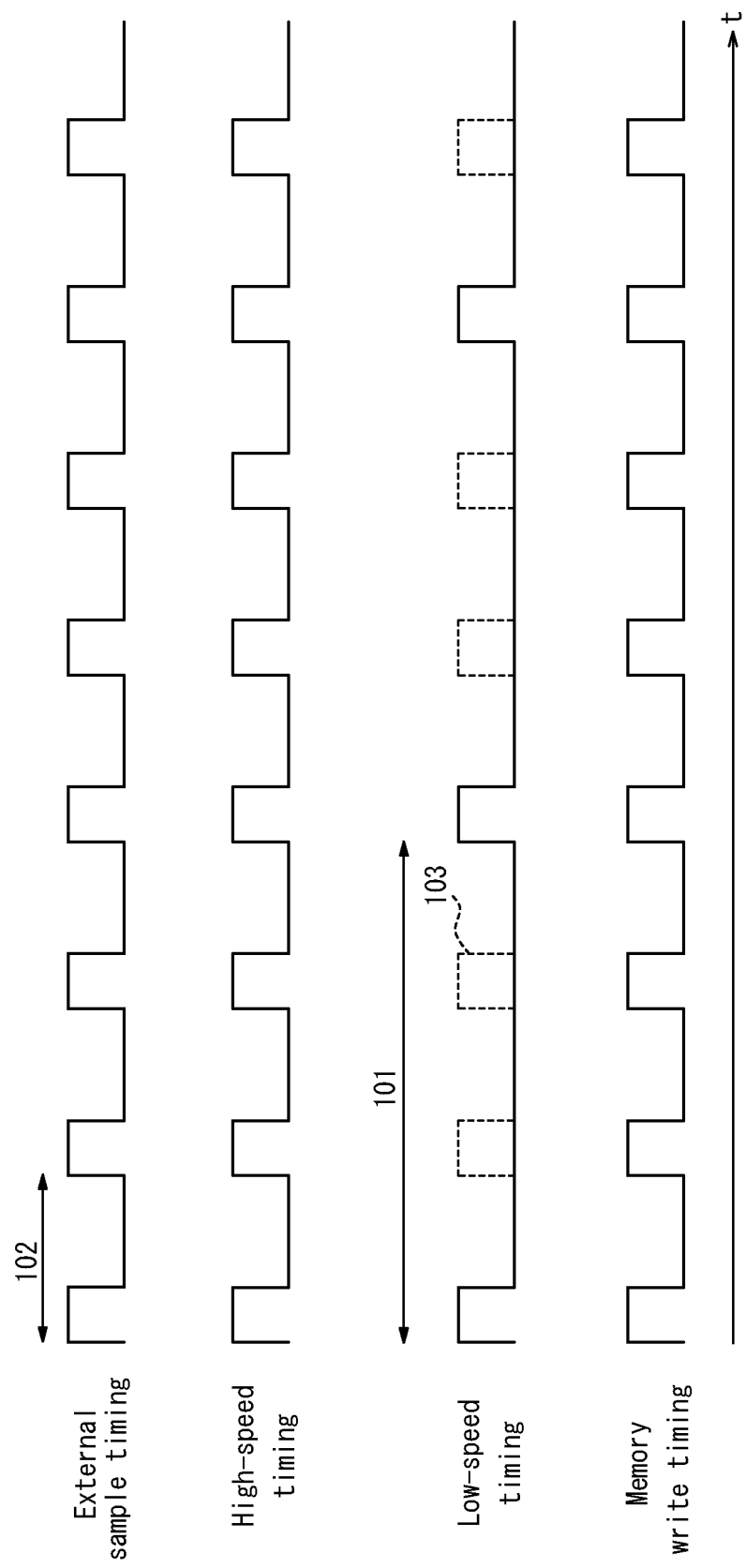
FIG. 2 is a timing chart schematically illustrating processing to decimate the sampling rate of the sampling signal.

FIG. 2 is a timing chart schematically illustrating processing, executed by the timing generation circuit 94, to decimate the sampling rate of the sampling signal. In FIG. 2, the external sample timing schematically illustrates the waveform of the sample timing inputted from an external source to the timing generation circuit 94. The high-speed timing schematically illustrates the waveform of the timing signal outputted from the timing generation circuit 94 to the A/D converter 92a. The low-speed timing schematically illustrates the waveform of the timing signal outputted from the timing generation circuit 94 to the A/D converter 92b. The memory write timing schematically illustrates the waveform of the timing signal outputted from the timing generation circuit 94 to the memory controller 95. In FIG. 2, a period 102 of the external sample timing is smaller than a period 101 of the low-speed timing. Therefore, to prevent a faster sample timing than the maximum sampling rate of the A/D converter 92b from being inputted to the A/D converter 92b, the timing generation circuit 94 decimates the sample timing in a case in which a faster timing than the maximum sampling rate is inputted. Specifically, as illustrated in FIG. 2, the timing generation circuit 94 masks signals, as indicated by 103, that the A/D converter 92b cannot keep up with among the signals of the external sample timing.

The A/D converters 92 (92a, 92b) perform A/D conversion in accordance with the sample timing indicated by the inputted timing signal and output the input signal, converted into a digital signal, to the interface circuits 93 (93a, 93b). The bit length of the digital signal outputted by the A/D converter 92a is shorter than the bit length of the digital signal outputted by the A/D converter 92b.

The interface circuits 93 (93a, 93b) convert the data format of the digital signals, inputted from the A/D converter 92 (92a, 92b), that have different bit lengths to make the data formats the same. The interface circuits 93 (93a, 93b) output the data of the input signals having the same data format to the memory controller 95 in accordance with the timing indicated by the timing signal inputted from the timing generation circuit 94.

The memory controller 95 stores the data of the input signals inputted from the interface circuits 93 (93a, 93b) in the waveform memory 96 in accordance with the timing indicated by the timing signal inputted from the timing generation circuit 94. The timing generation circuit 94 outputs, to the memory controller 95, a timing signal indicating the same timing as the sampling signal inputted to the A/D converter 92a, which performs faster A/D conversion processing. Therefore, the memory controller 95 stores the data of the input signals of CH 1 and CH 2 in the waveform memory 96 at the sampling rate of the A/D converter 92a that performs high-speed A/D conversion. In a case in which the data transfer of the low-speed A/D converter 92b cannot keep up, the memory controller 95 stores the same data in the waveform memory 96 as the data stored immediately before. This operation of repeatedly storing the same data as the data stored immediately before is referred to as padding.

Based on control by a processor such as a central processing unit (CPU), the data stored in the waveform memory 96 is used, as necessary, by the waveform creation circuit 97 to create a display waveform that is displayed on the display 98.

Figure 3:
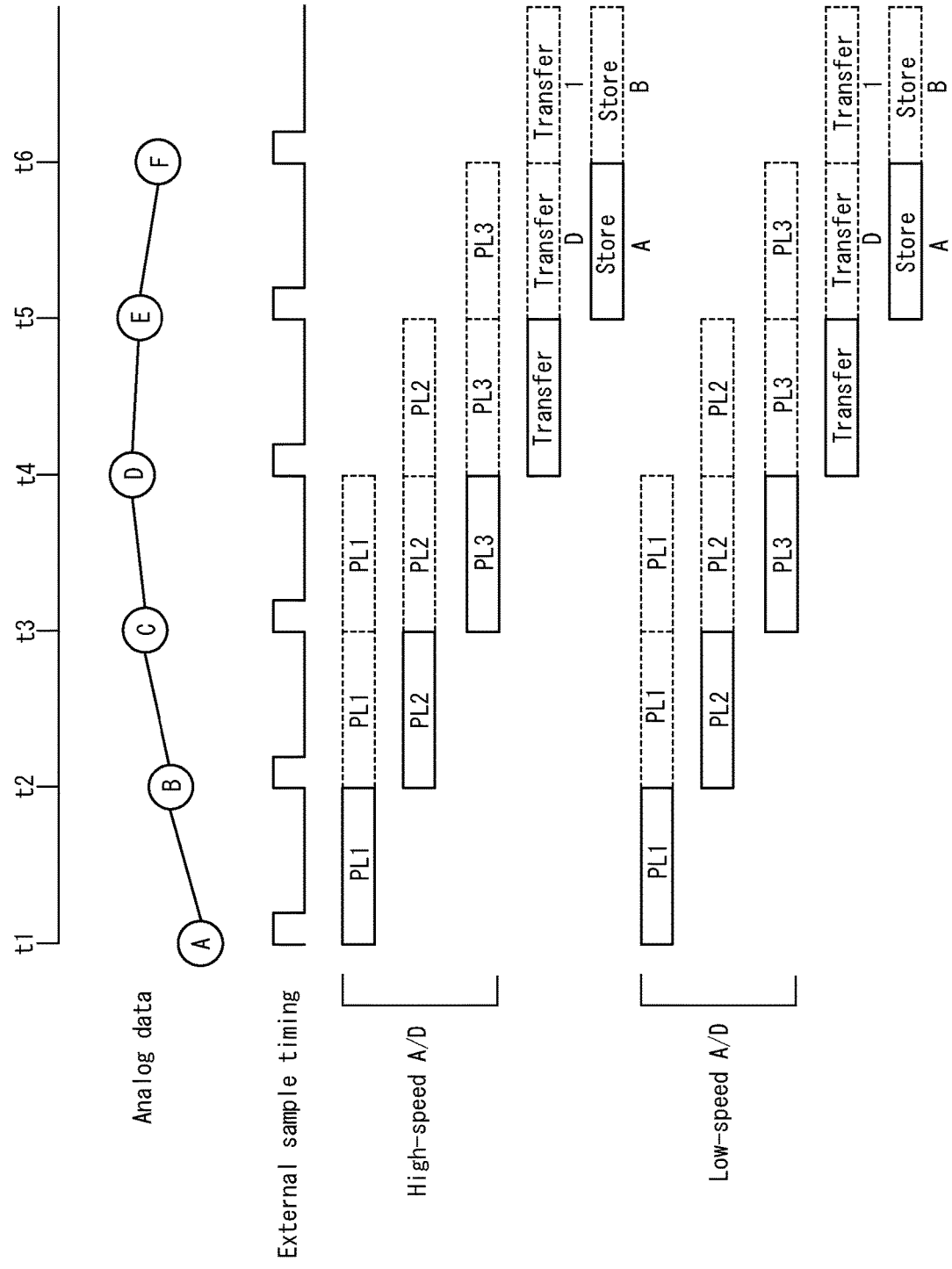
FIG. 3 is a timing chart schematically illustrating processing by A/D converters 92a, 92b of FIG. 1.
Figure 4A:
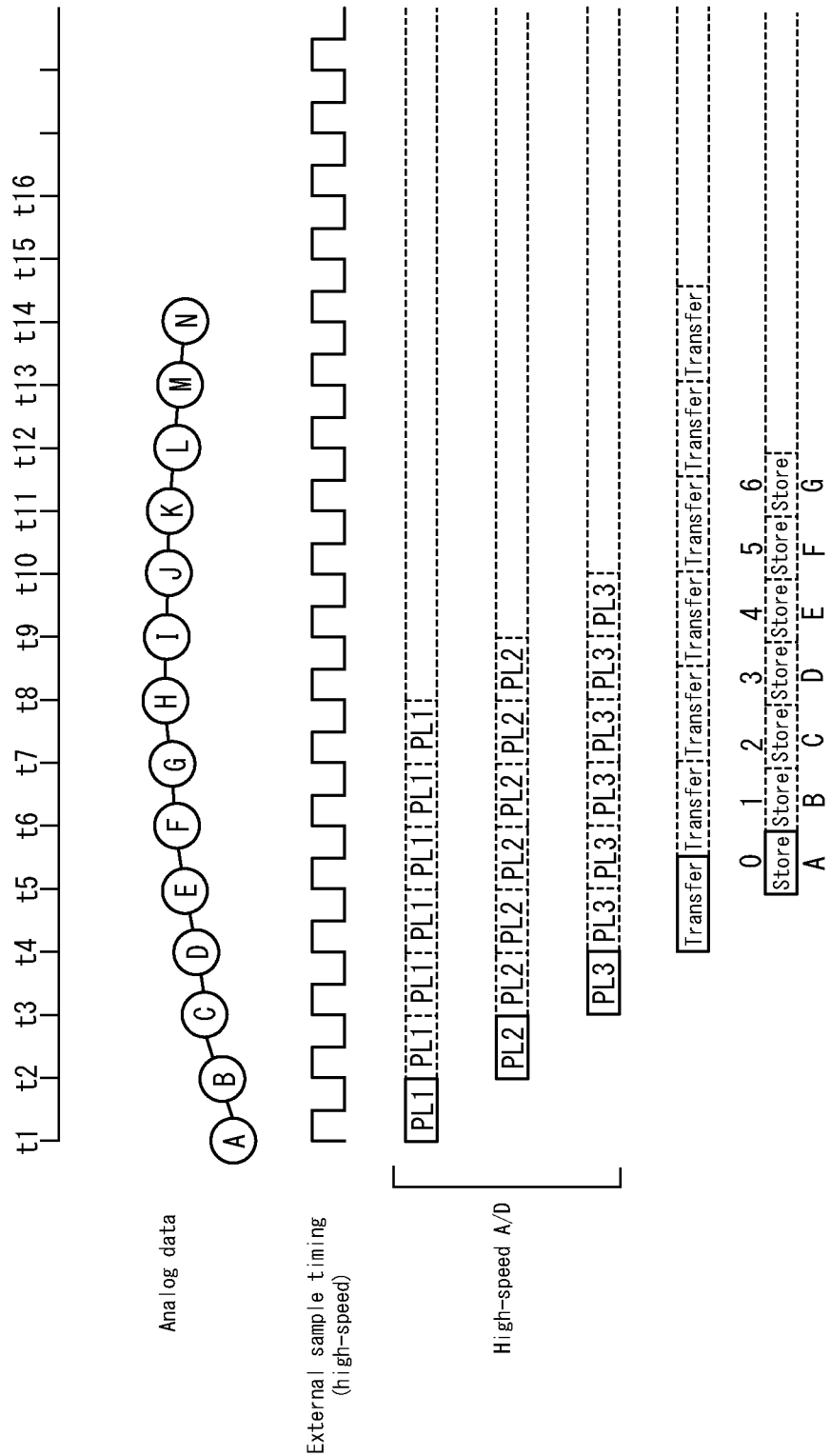
FIG. 4A is a timing chart schematically illustrating processing by the A/D converter 92a of FIG. 1.
Figure 4B:
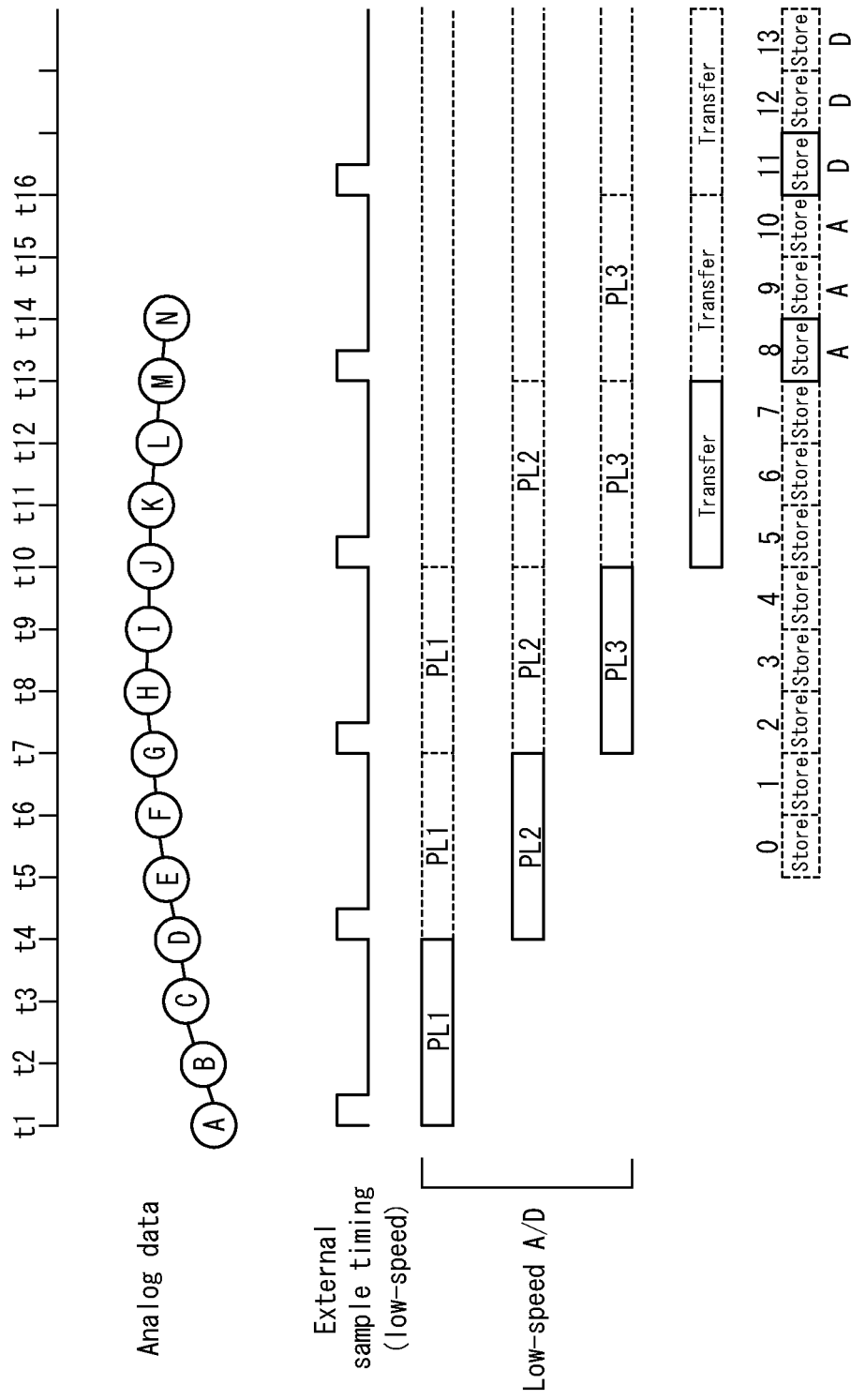
FIG. 4B is a timing chart schematically illustrating processing by the A/D converter 92b of FIG. 1.

Next, with reference to FIGS. 3, 4A, and 4B, operations by the measurement device 90 are described. FIG. 3 is a timing chart schematically illustrating processing by the A/D converters 92a, 92b in the case in which the sampling rate of the external sample timing does not exceed the maximum sampling rate of the A/D converter 92b of CH 2, which is the low-speed side. In FIG. 3, t1, t2, t3, . . . indicate times at which sampling is to be performed as indicated by the external sample timing. A, B, C, . . . indicate the variation in the value of the analog data according to the vertical position in the drawing. The "external sample timing" schematically illustrates the waveform of the sample timing inputted from an external source to the timing generation circuit 94. The "high-speed A/D" indicates the processing in the A/D converter 92a for CH 1. The "low-speed A/D" indicates the processing in the A/D converter 92b for CH 2.

Generally, inside an A/D converter, data processing is performed by pipeline processing to improve the efficiency of processing. Therefore, several clock cycles are required from when the timing signal is inputted until the converted data is outputted. In the example of FIG. 3, the A/D conversion of analog data A starts at time t1, the internal pipeline processing is performed at time t2, and internal pipeline processing for the second clock cycle is performed at time t3. At t4, data is outputted from the A/D converters 92a, 92b, inputted to the interface circuits 93a, 93b, and transferred to the memory controller 95. At t5, digital data corresponding to the analog data A is stored in the waveform memory 96. In this way, in the example of FIG. 3, four clock cycles are required from the start of the A/D conversion to the storage in the waveform memory 96. In FIG. 3, the external sample timing does not exceed the maximum sampling rate of the low-speed A/D converter 92b for CH 2. The same timing is therefore inputted to the high-speed A/D converter 92a and the low-speed A/D converter 92b. Since the timing inputted to each channel is the same, the data stored in the waveform memory 96 is also data for the same timing, and no time shift occurs in the stored data.

However, in a case in which the external sample timing is higher than the maximum sampling rate of the low-speed A/D converter 92b for CH 2, a time shift occurs between the data outputted from the high-speed A/D converter 92a for CH 1 and the low-speed A/D converter 92b. This point is now explained with reference to FIGS. 4A and 4B. FIG. 4A is a timing chart schematically illustrating processing by the A/D converter 92a in the case in which the sampling rate of the external sample timing exceeds the maximum sampling rate of the A/D converter 92b. FIG. 4B is a timing chart schematically illustrating the processing by the A/D converter 92b in the case in which the same external sample timing as FIG. 4A is inputted. In general, a malfunction occurs when timing at a rate higher than the maximum sampling rate characteristic of the A/D converter is inputted to the A/D converter. The timing signal therefore needs to be decimated before being input, so that the maximum sampling rate is not exceeded. As described above with reference to FIG. 2, the timing generation circuit 94 thus outputs a timing signal yielded by decimating the sample timing to the low-speed A/D converter 92b for CH 2.

In FIG. 4A, on the high-speed A/D converter side (CH 1), the A/D conversion result for the analog data A is stored in the waveform memory 96 at time t5, which is four clock cycles after the A/D conversion processing starts at time t1, as in FIG. 3. With regard to the timing for the low-speed A/D converter 92*b* for CH 2, the sample timing is decimated by the timing generation circuit 94 to prevent the A/D converter 92*b* from malfunctioning. As illustrated in FIG. 4B, the timing to the low-speed side (CH 2) is decimated and applied at times t1, t4, t7, t10, and t13 so as not to exceed the maximum sampling rate of the A/D converter 92*b*.

In the A/D converter 92*b*, conversion of the analog data A starts at time t1, but pipeline processing over four clock cycles is necessary until the data is outputted, as on the high-speed side (CH 1). Therefore, pipeline processing is performed at time t4 and time t7, data is transferred to the memory controller 95 at time t10, and storage of data corresponding to the analog data A in the waveform memory 96 starts at time t13. The memory controller 95 stores data at the timing of the high-speed A/D converter 92*a* to align the stored number of pieces of A/D converted data from the high-speed side (CH 1) and the stored number of pieces of A/D converted data from the low-speed side (CH 2). When there is no data transfer from the low-speed A/D converter 92*b*, the memory controller 95 repeats storage of the most recently transferred data to implement data padding. Note that the external sample timing is an external factor from the viewpoint of the measurement device 90 and is an irregular, unpredictable event. Therefore, in general, the interval of decimation in the timing generation circuit 94 is irregular and is unrelated to the number of pieces of data from the high-speed side (CH 1) and the low-speed side (CH 2). Consequently, if the data from the low-speed side (CH 2) is not padded to align the number of pieces of data, the correspondence between the high-speed data and the low-speed data will be lost after data capture.

As is clear from FIGS. 4A and 4B, A/D converted data A, B, C, . . . are stored in order in the waveform memory 96 on the high-speed side (CH 1). In FIG. 4A, the A/D converted data A, B, C, . . . on the high-speed side (CH 1) is stored in areas corresponding to addresses 0, 1, 2, . . . used on the high-speed side (CH 1) of the waveform memory 96. On the low-speed side (CH 2), at time t5 when data storage in the high-speed side (CH 1) starts, the pipeline processing of the A/D converter 92*b* has not been completed in time. Data that was subjected to A/D conversion in the past and remains in the pipeline is therefore stored in the waveform memory 96 as an indefinite value. In the example of FIG. 4B, indefinite values are stored in the areas corresponding to addresses 0, 1, 2, . . . , 7 used on the low-speed side (CH 2) of the waveform memory 96. The data corresponding to the analog data A is stored starting at the area for address 8 of the waveform memory 96, and the storage position is shifted from that of the high-speed data. The amount of this shift in the data depends on the sampling rate of the sample timing (sampling signal) provided from the external source. Since the sampling rate of the sampling signal varies in real time, the amount of the data shift between the high-speed side (CH 1) and the low-speed side (CH 2) is not constant, but rather varies depending on the state of external sampling. If waveforms for the high-speed data and low-speed data are simultaneously lined up and displayed on the display 98, the waveforms include the time shift as measurement error.

Therefore, in the measurement device 90 of the comparative example, the waveforms of the output signals of each module cannot be correctly compared in real time when the sampling rate of the sampling signal exceeds the maximum sampling rate of a portion of the modules.

EMBODIMENTS

Embodiments of the present disclosure are now described with reference to the drawings. Portions having an identical configuration or function in the drawings are labeled with the same reference signs. In the explanation of the embodiments, a redundant description of identical portions may be omitted or simplified as appropriate.

First Embodiment

Even when external sampling is performed using A/D converters having different maximum sampling rates (maximum sampling periods), a measurement device 10*a* according to the present embodiment aligns the amount of data delay from each A/D converter and stores the data in a waveform memory 16 in a manner that maintains the simultaneity of sampling for each A/D converter. Therefore, according to the measurement device 10*a*, sampling errors between modules can be eliminated, making it possible to compare the waveforms of the output signals of each module correctly in real time.

Figure 5:
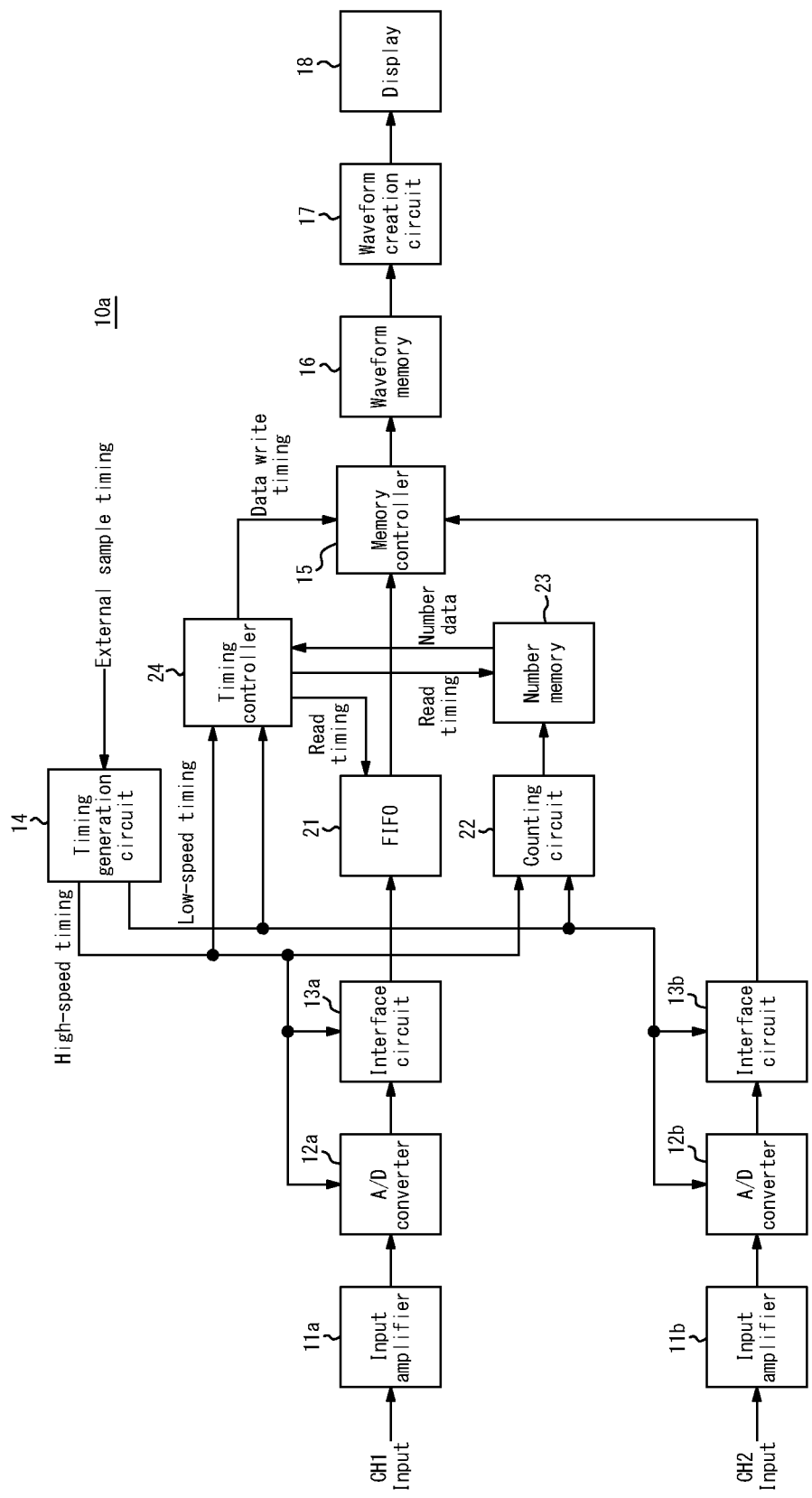
FIG. 5 is a block diagram schematically illustrating a configuration of a measurement device according to a first embodiment.

FIG. 5 is a block diagram schematically illustrating a configuration of the measurement device 10*a* according to the first embodiment. The measurement device 10*a* includes input amplifiers 11 (11*a*, 11*b*), A/D converters 12 (12*a*, 12*b*), interface circuits 13 (13*a*, 13*b*), a timing generation circuit 14, a memory controller 15, a waveform memory 16, a waveform creation circuit 17, a display 18, a FIFO (First In First Out) 21, a counting circuit 22, a number memory 23, and a timing controller 24. The measurement device 10*a* receives input of an input signal in analog form from each of CH 1 and CH 2, converts the input signals into digital signals in the input circuit for each channel, and displays the digital signals on the display 18. The input amplifier 11*a*, the A/D converter 12*a* as a first processor, and the interface circuit 13*a* function as an input circuit (input module) that performs A/D conversion on the signal of CH 1. The input amplifier 11*b*, the A/D converter 12*b* as the second processor, and the interface circuit 13*b* function as an input circuit that performs A/D conversion on the signal of CH 2. The A/D converter 12*a* for CH 1 has a low A/D conversion resolution, but can perform high-speed A/D conversion. The A/D converter 12*b* for CH 2 has a higher A/D conversion resolution than the A/D converter 12*a*, but the A/D conversion is low-speed. Below, an example is described in which the sampling rate of the external sample timing does not exceed the maximum sampling rate of the A/D converter 12*a* but exceeds the maximum sampling rate of the A/D converter 12*b*. The measurement device 10*a* temporarily stores the high-speed A/D converted data for CH 1 in the FIFO 21 as the storage and writes the data to the waveform memory 16 in accordance with the timing of the output of the low-speed A/D converted data for CH 2, thereby eliminating the time shift between the high-speed data and low-speed data. In other words, the FIFO 21, the counting circuit 22 as the counter, the number memory 23, and the timing controller 24 as the controller or timing generator function as the adjustment unit to adjust the time shift between the output signal of the interface circuit 13*a* and the output signal of the interface circuit 13*b*.

The input amplifiers 11 (11*a*, 11*b*) receive an analog electric signal corresponding to a physical quantity as an input signal and amplify the input signal in accordance with the standard of the A/D converters 12 (12a, 12b). The analog signal of CH 1 that is to be observed is normalized by the input amplifier 11a and outputted to the A/D converter 12a. At the same time, the analog signal of CH 2 that is to be observed is normalized by the input amplifier 11b and outputted to the A/D converter 12b.

The timing generation circuit 14 receives input of an external sample timing, which is a sampling signal that defines the sample timing, from an external source. The timing generation circuit 14 outputs the sample timing as a timing signal indicating the conversion timing for the A/D converters 12 (12a, 12b) after decimating the sample timing appropriately so that the maximum sampling rate of the A/D converter 12 (12a, 12b) for each channel is not exceeded. The processing, executed by the timing generation circuit 14, to decimate the sample timing of the sampling signal is similar to the processing by the timing generation circuit 94 included in the measurement device 90 according to the comparative example, described with reference to FIG. 2. The timing generation circuit 14 outputs a timing signal for high-speed timing indicating the same timing as the external sample timing to the A/D converter 12a, the interface circuit 13a, the FIFO 21, the counting circuit 22, and the timing controller 24. The timing generation circuit 14 outputs a timing signal for low-speed timing, indicating a timing yielded by decimating the external sample timing in accordance with the maximum sampling rate of the A/D converter 12b, to the A/D converter 12b, the interface circuit 13b, the FIFO 21, the counting circuit 22, and the timing controller 24.

The A/D converters 12 (12a, 12b) perform A/D conversion in accordance with the sample timing indicated by the inputted timing signal and output the input signal, converted into a digital signal, to the interface circuits 13 (13a, 13b). The bit length of the digital signal outputted by the A/D converter 12a is shorter than the bit length of the digital signal outputted by the A/D converter 12b.

The interface circuits 13 (13a, 13b) convert the data format of the digital signals, inputted from the A/D converter 12 (12a, 12b), that have different bit lengths to make the data formats the same. The interface circuit 13a outputs the data of the input signal having the same data format to the FIFO 21 in accordance with the high-speed timing indicated by the timing signal inputted from the timing generation circuit 14. The A/D converted data from the A/D converter 12a is thereby stored in the FIFO 21. The interface circuit 13b outputs the data of the input signal having the same data format to the memory controller 15 in accordance with the low-speed timing indicated by the timing signal inputted from the timing generation circuit 14.

The A/D converted data, from the A/D converter 12a, stored in the FIFO 21 is read by a read signal from the timing controller 24 and is inputted to the memory controller 15. The memory controller 15 stores the A/D converted data from the A/D converter 12a in the waveform memory 16 in response to a data write timing signal from the timing controller 24.

The A/D converted data, from the A/D converter 12b, inputted to the memory controller 15 is stored in the waveform memory 16 in response to a data write timing signal from the timing controller 24. In a case in which the rate of the data write timing signal from the timing controller 24 is faster than the data rate from the low-speed A/D converter 12b, the memory controller 15 stores the most recently transferred data from the interface circuit 13b as padding in the waveform memory 16.

The counting circuit 22 counts the number of times the high-speed timing occurs each time the counting circuit 22 receives the timing signal for the low-speed timing from the timing generation circuit 14. In other words, the counting circuit 22 resets the number of occurrences of the high-speed timing when a timing signal for the low-speed timing occurs and then starts counting the number of times the high-speed timing occurs. The counting circuit 22 increments the number of times by one for each occurrence of the high-speed timing. In this way, the counting circuit 22 counts the number of times the high-speed timing occurs between the occurrence of one low-speed timing and the occurrence of the next low-speed timing. The counting circuit 22 stores the counting result as number data in the number memory 23 for each occurrence of the low-speed timing. The number memory 23 may store the number data in a FIFO manner, for example.

The timing controller 24 reads the number data from the number memory 23 based on the high-speed timing and low-speed timing from the timing generation circuit 14. The timing controller 24 outputs a write signal to the memory controller 15 to read data from the FIFO 21 the number of times indicated by the read number data.

The memory controller 15 receives the write signal and stores the data from the FIFO 21 in the waveform memory 16. At the same time, the memory controller 15 receives the high-speed data from the interface circuit 13b and stores the data in the waveform memory 16. In a case in which the data transfer of the low-speed A/D converter 12b cannot keep up, the memory controller 15 performs padding by storing the same data in the waveform memory 16 as the data stored immediately before.

Based on control by a processor such as a CPU, the data stored in the waveform memory 16 is used, as necessary, by the waveform creation circuit 17 as the creation unit to create a display waveform that is displayed on the display 18. The display 18 is, for example, implemented by a liquid crystal display (LCD), an organic electro-luminescent display (OELD), or the like.

Figure 6:
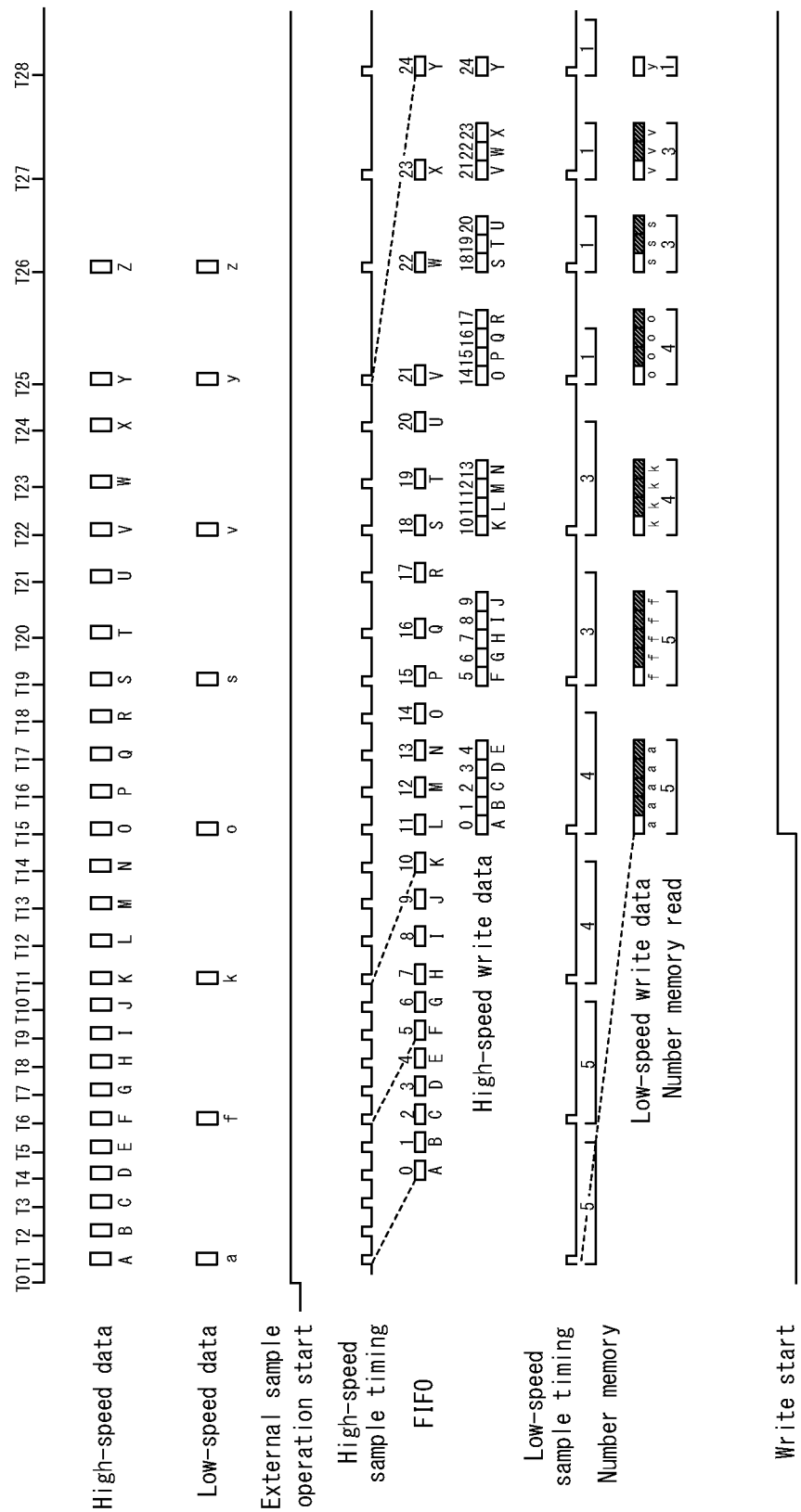
FIG. 6 is a timing chart schematically illustrating processing by A/D converters 12a, 12b of FIG. 5.

Next, with reference to FIG. 6, operations by the measurement device 10a are described. FIG. 6 is a timing chart schematically illustrating processing by A/D converters 12a, 12b of FIG. 5. FIG. 6 illustrates an example of processing by the A/D converters 12a, 12b in a case in which the sampling rate of the external sample timing exceeds the maximum sampling rate of the A/D converter 12b but does not exceed the maximum sampling rate of the A/D converter 12a. In FIG. 6, T1, T2, T3, . . . indicate times at which sampling is to be performed as indicated by the external sample timing. FIG. 6 illustrates an example in which the time interval of the external sample timing widens with the passage of time, but the external sample timing may vary in any way. The "high-speed data" indicates the data for the analog signal inputted from CH 1. The "low-speed data" indicates the data for the analog signal inputted from CH 2. The "external sample operation start" indicates the timing at which sampling with the measurement device 10a starts by a binary signal switching from OFF to ON. The "high-speed sample timing" indicates the waveform of the high-speed timing that defines the processing in the A/D converter 12a and the like for CH 1. "FIFO" indicates the data written to the FIFO 21. The "high-speed write data" indicates the high-speed (CH 1) data read from the FIFO 21 and written to the waveform memory 16 by the memory controller 15. The "low-speed sample timing" indicates the waveform of the low-speed timing that defines the processing in the A/D converter 12b and the like for CH 2. The "number memory"

indicates the number, stored in the number memory 23, of high-speed samples. The "low-speed write data" indicates the low-speed (CH 2) data written to the waveform memory 16 from the interface circuit 13b by the memory controller 15. The "number memory read" indicates the number data that is read from the number memory 23. The "write start" indicates the timing at which the low-speed (CH 2) data is written to the waveform memory 16 by a binary signal switching from OFF to ON.

In the example of FIG. 6, an external sampling operation starts at time T0. When an external sample timing is inputted from an external source at time T1, the timing generation circuit 14 outputs a high-speed sample timing to the A/D converter 12a, the interface circuit 13a, FIFO 21, the counting circuit 22, and the timing controller 24. This signal starts the operation of the high-speed A/D converter 12a. The A/D converter 12a performs A/D conversion by pipeline processing. In the example of FIG. 6, high-speed data A at T1 is outputted from the interface circuit 13a and stored in the FIFO 21 at time T4. Thereafter, at times T2, T3, . . . , when the sample timing is inputted sequentially from the external source, the timing generation circuit 14 responds by outputting a high-speed sample timing. Accordingly, high-speed input data B, C, . . . for CH 1 sequentially undergoes digital conversion. In the example of FIG. 6, the digital data for data B at time T2 is stored in the FIFO 21 at time T5, and the digital data for data C at time T3 is stored in the FIFO 21 at time T6. Hereafter, according to the high-speed sample timing, the data on which A/D conversion has been performed by the A/D converter 12a is stored sequentially in the FIFO 21 at the high-speed sample timing.

On the other hand, the timing generation circuit 14 decimates the sample timing inputted from the external source so as not to exceed the maximum sampling rate of the low-speed A/D converter 12b and outputs the low-speed sample timing as low-speed samples at times T1, T6, T11, and T15. In this low-speed sample timing, the A/D converter 12b converts low-speed data a at time T1, low-speed data f at time T6, low-speed data k at time T11, low-speed data o at time T15, . . . to digital data. Since the low-speed A/D converter 12b also performs pipeline processing, the low-speed data a at T1 is outputted from the interface circuit 13b at time T15.

The counting circuit 22 counts the number of times a high-speed sampling occurs between the occurrence of one low-speed sampling and the occurrence of the next low-speed sampling. For example, in FIG. 6, the first low-speed sample occurs at time T1, and the next low-speed sample occurs at T6. The counting circuit 22 counts the number of high-speed samples that occur during this time. In this example, the high-speed samples occur at times T1, T2, T3, T4, and T5, so the counting result is 5. The counting circuit 22 sequentially stores such a counting result in the number memory 23 at the timing of occurrence of the low-speed sample. In FIG. 6, by the next low-speed sample timing at time T11, high-speed samples have occurred five times, at times T6, T7, T8, T9, and T10, and the counting circuit 22 stores this in the number memory 23 at the timing of time T11. Thereafter, the counting circuit 22 stores 4 at the timing of time T15, and 4 at the timing of T18.

The timing controller 24 has a function to stand by from time T1, when the external sample operation start is switched from OFF to ON, until the low-speed A/D converter 12b (CH 2) outputs valid data. In FIG. 6, time T15 is when the first low-speed (CH 2) data is outputted from the interface circuit 13b. The timing controller 24 therefore stands by until time T15. After standing by until time T15, the timing controller 24 reads the first value from the number memory 23. The timing controller 24 controls the memory controller 15 to read the same number of data pieces from the FIFO 21 as the number data that was read from the number memory 23 and write the data read from the FIFO 21 to the waveform memory 16. At the same time, the timing controller 24 controls the memory controller 15 to write the data outputted from the low-speed A/D converter 12b consecutively the same number of times as the number data that was read from the number memory 23. In the example of FIG. 6, at time T15, high-speed data A, B, C, D, E are written to the waveform memory 16, and the low-speed data a is repeatedly written five times.

Subsequently, at the low-speed sample timing, the timing controller 24 reads the number data from the number memory 23, and according to the number data, the high-speed (CH 1) digital data is read from the FIFO 21 and stored in the waveform memory 16. In parallel with this, the same low-speed (CH 2) digital data is consecutively stored in the waveform memory 16 a number of times equal to the number data read from the number memory 23. In the example of FIG. 6, the number 5 is read from the number memory 23 at time T19, and data F, G, H, I, J are read from the FIFO 21 and stored in the waveform memory 16. At the same time, low-speed data f is stored in the waveform memory 16 five times consecutively. Similarly, the number 4 is read from the number memory 23 at time T22, and data K, L, M, N are read from the FIFO 21 and stored in the waveform memory 16. In parallel with this, low-speed data k is stored in the waveform memory 16 five times consecutively.

Figure 7:
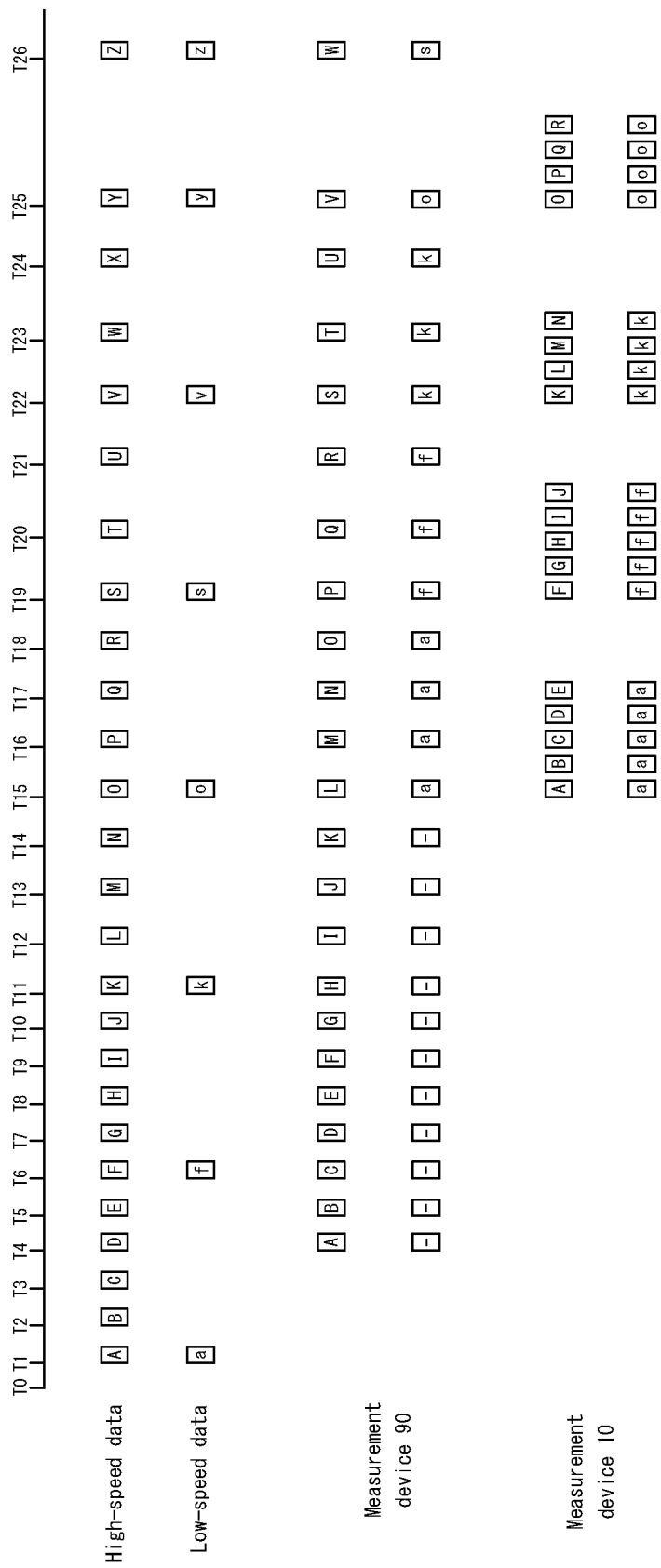
FIG. 7 is a timing chart schematically illustrating processing results of a measurement device according to an embodiment.

FIG. 7 is a timing chart schematically illustrating the result of the above-described processing by the measurement device 10a. FIG. 7 illustrates the data stored in the waveform memory 96 by the measurement device 90 according to the comparative example and the data stored in the waveform memory 16 by the measurement device 10. In the measurement device 90, in a case in which sampling is performed at an external sample timing that exceeds the maximum sampling rate of the low-speed A/D converter 92b, a sampling shift occurs between the high-speed sampling data and the low-speed sampling data. For example, the high-speed data A in the measurement device 90 is stored in the waveform memory 96 at time T4, and the low-speed data a is stored in the waveform memory 96 at time T15. In contrast, in the measurement device 10a, the high-speed sampling data and the low-speed sampling data are sampled in synchronization with the data to be captured, and no shift occurs in sampling. For example, the high-speed data A in the measurement device 10a and the low-speed data a are both stored in the waveform memory 16 at time T15. In the measurement device 10a, the low-speed sampling data is padded during high-speed sampling until the next low-speed sampling data is outputted. For example, the low-speed data a outputted at time T15 is padded four times, which is the same number as the high-speed data B to E, until the next low-speed data f is outputted at time T19.

In this way, even when sampling is performed at a sample timing, from an external source, that exceeds the sampling rate of the low-speed A/D converter 12b, the measurement device 10a can correctly acquire the low-speed data and interpolate by padding. Therefore, according to the measurement device 10a, waveforms can be measured and compared between the high-speed sampling and the low-speed sampling without the occurrence of a time shift in sampling.

Figure 8:
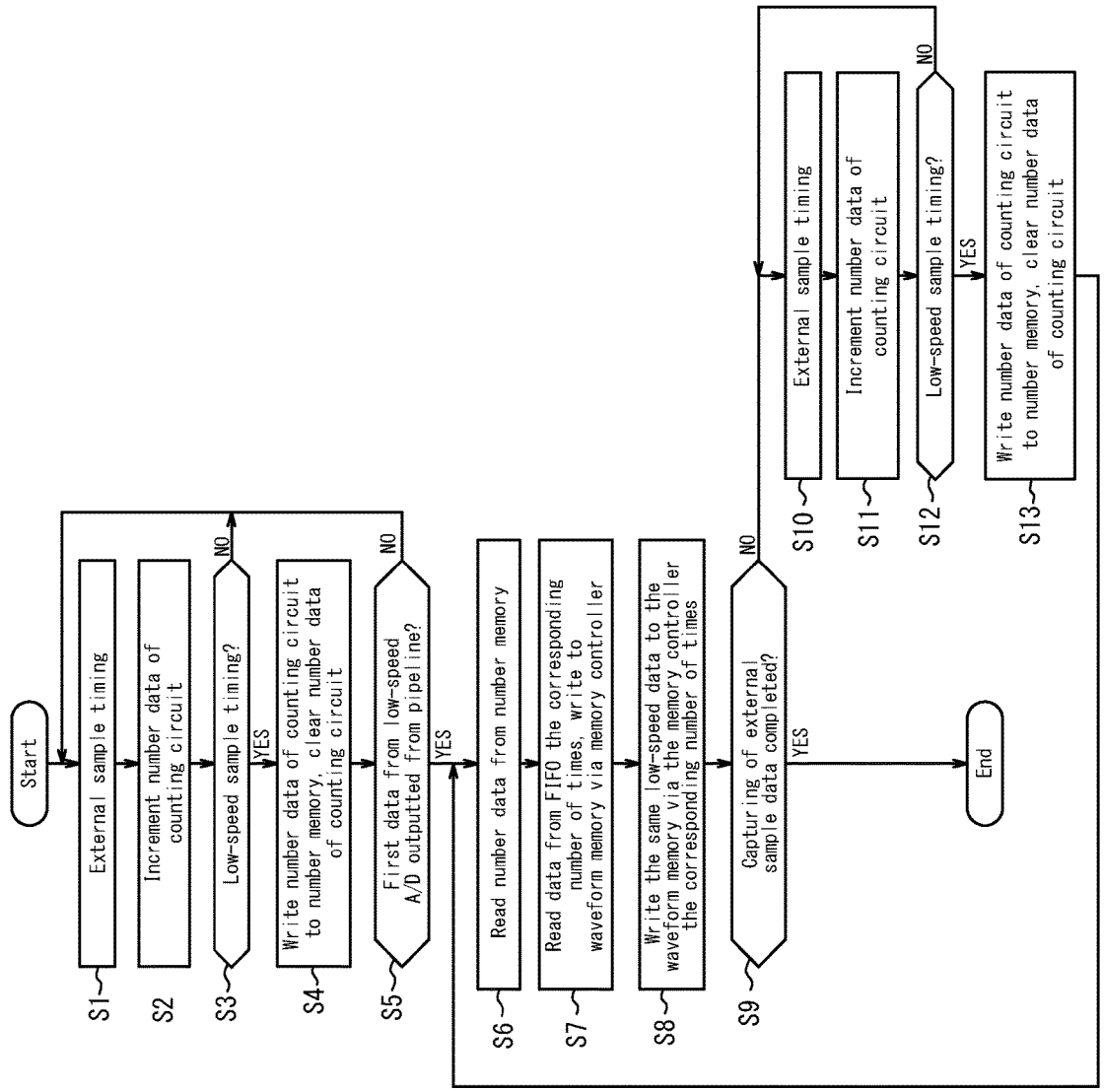
FIG. 8 is a flowchart illustrating processing procedures of a measurement device according to an embodiment.

FIG. 8 is a flowchart illustrating processing procedures of the measurement device 10a according to an embodiment. The operations of the measurement device 10a described with reference to FIG. 8 correspond to one of the measurement methods of the measurement device 10a according to the present embodiment. The operation in each step of FIG. 8 is executed based on control by the measurement device 10a.

In step S1 of FIG. 8, the timing generation circuit 14 of the measurement device 10a receives input of a sample timing from an external source.

In step S2, the counting circuit 22 of the measurement device 10a increments the number data by one.

In step S3, the measurement device 10a determines whether the sample timing from the external source corresponds to the sample timing of the low-speed A/D converter 12b. In a case in which the sample timing corresponds to the sample timing of the A/D converter 12b (step S3: YES), the measurement device 10a proceeds to step S4. Otherwise (step S3: NO), the measurement device 10a returns to step S1.

In step S4, the counting circuit 22 of the measurement device 10a writes the number data counted by the counting circuit 22 to the number memory 23, then clears and resets the number data to 0.

In step S5, the measurement device 10a determines whether the first data from the low-speed A/D converter 12b has been outputted from the pipeline. In a case in which the data has been outputted (step S5: YES), the measurement device 10a proceeds to step S6. Otherwise (step S5: NO), the measurement device 10a returns to step S1.

In step S6, the timing controller 24 of the measurement device 10a reads the number data from the number memory 23.

In step S7, the timing controller 24 of the measurement device 10a performs control to read data from the FIFO 21 the number of times indicated by the number data read in step S6 and write the data to the waveform memory 16 via the memory controller 15.

In step S8, the timing controller 24 of the measurement device 10a performs control to repeatedly write the low-speed data outputted from the interface circuit 13b to the waveform memory 16, via the memory controller 15, the number of times indicated by the number data read in step S6.

In step S9, the measurement device 10a determines whether the capturing of the sample data from the external source is completed. In a case in which the capturing is determined to be completed (step S9: YES), the measurement device 10a ends the processing of the flowchart. Otherwise (step S9: NO), the measurement device 10a proceeds to step S10.

In step S10, the timing generation circuit 14 of the measurement device 10a receives input of a sample timing from an external source.

In step S11, the counting circuit 22 of the measurement device 10a increments the number data by one.

In step S12, the measurement device 10a determines whether the sample timing from the external source corresponds to the sample timing of the low-speed A/D converter 12b. In a case in which the sample timing corresponds to the sample timing of the A/D converter 12b (step S12: YES), the measurement device 10a proceeds to step S13. In a case in which the sample timing does not correspond to the sample timing of the A/D converter 12b (step S12: NO), the measurement device 10a returns to step S10.

In step S13, the counting circuit 22 of the measurement device 10a writes the number data counted by the counting circuit 22 to the number memory 23, then clears and resets the number data to 0. The measurement device 10a then returns to step S6.

In FIGS. 6 and 7, an example has been described in which the number of pipeline stages of the high-speed A/D converter 12a and the low-speed A/D converter 12b are the same, but the pipeline stages need not be aligned in number. Also, in the present embodiment, an example has been described in which A/D conversion processing is performed as the pipeline processing executed by the measurement device 10a, but processing other than A/D conversion processing may be performed.

Second Embodiment

In the first embodiment, an example configuration has been described in which the high-speed A/D converted data is temporarily stored in the FIFO 21 and written to the waveform memory 16 in accordance with the timing at which the low-speed A/D converted data is outputted, thereby eliminating the time shift between the high-speed data and low-speed data. In a measurement device 10b of the present embodiment, the high-speed A/D converted data is stored in the waveform memory 16 immediately after being outputted from the interface circuit 13a, but the timing of reading the high-speed data from the waveform memory 16 to the waveform creation circuit 17 is adjusted to match the low-speed data output. Therefore, according to the measurement device 10b, the time shift between the high-speed data and low-speed data can be eliminated.

Figure 9:
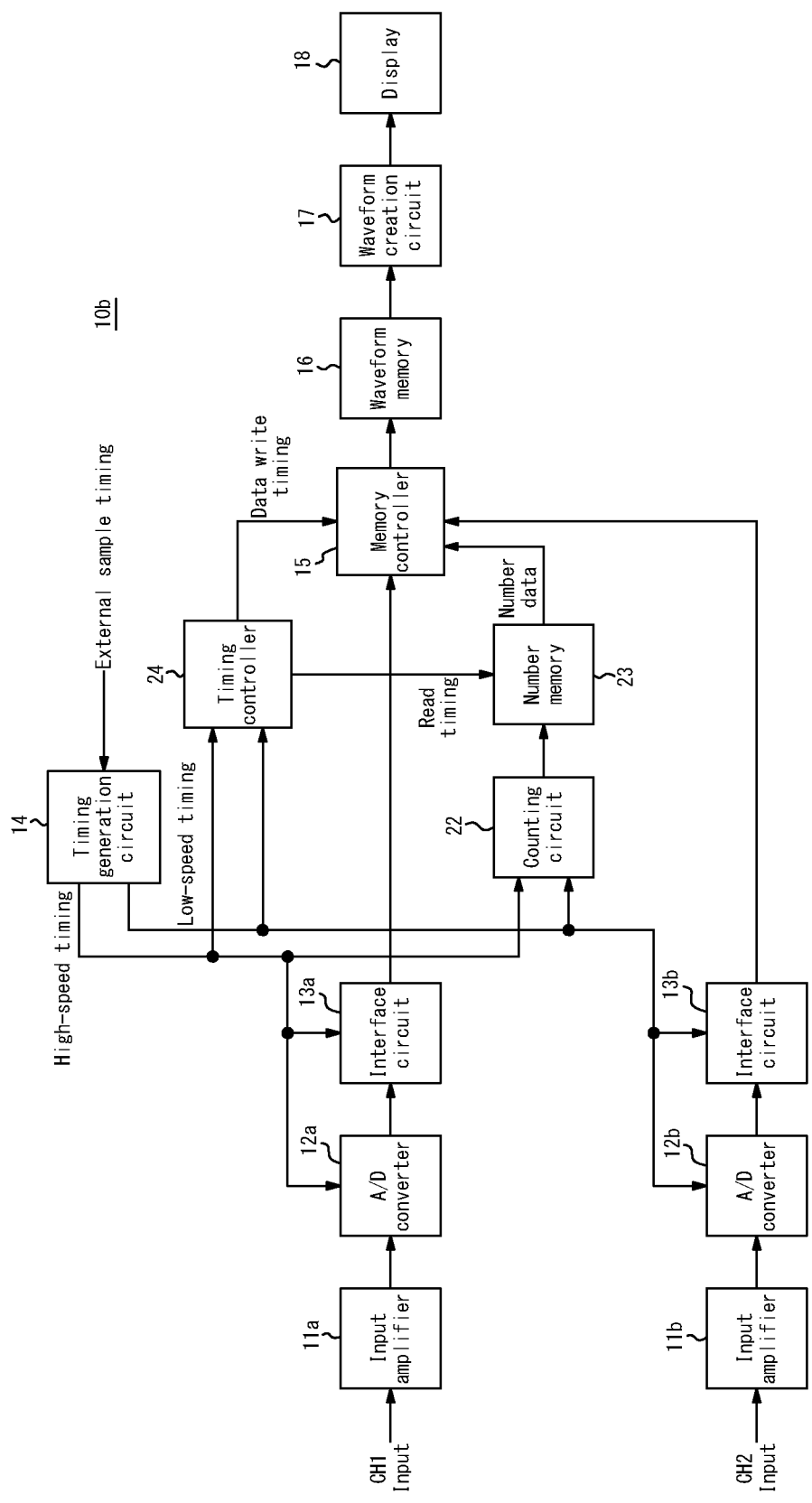
FIG. 9 is a block diagram schematically illustrating a configuration of a measurement device according to a second embodiment.

FIG. 9 is a block diagram schematically illustrating a configuration of the measurement device 10b according to the second embodiment. In FIG. 9, configurations having the same function as in the first embodiment are labeled with the same signs, and a detailed description thereof is omitted.

In the measurement device 10b, high-speed (CH 1) data is written directly from the interface circuit 13a to the waveform memory 16 via the memory controller 15, without going through a FIFO, in response to the occurrence of a high-speed timing. On the other hand, as in the first embodiment, the counting circuit 22 counts the number of times the high-speed timing occurs between the occurrence of one low-speed timing and the occurrence of the next low-speed timing. The counting circuit 22 stores the counting result as number data in the number memory 23 for each occurrence of the low-speed timing. The low-speed (CH 2) data is read out from the interface circuit 13b at each low-speed sample timing from the start of data writing of the low-speed data, and the data is written to the waveform memory 16 via the memory controller 15 repeatedly a number of times equal to the number read from the number memory 23. The waveform creation circuit 17 reads the written amount of data for each of the high-speed data and the low-speed data, creates waveforms, and displays the waveforms on the display 18. The waveform creation circuit 17 delays the display of high-speed sampling data by reading the same number of pieces high-speed data as the number of pieces of data stored in the waveform memory 16 by the low-speed side and then creating a waveform. In this way, the reading of high-speed data can be synchronized with the low-speed data.

FIG. 10 is a flowchart illustrating processing procedures of a measurement device according to the present disclosure. As described above, in the measurement device 10 (10a, 10b) for measuring a waveform of an input signal, the A/D converter 12a performs first pipeline processing on a first input signal according to a first sample timing (fast timing) (step S21). The A/D converter 12b performs second pipeline processing on a second input signal according to a second sample timing (slow timing) that has a sampling period longer than the first sample timing (step S22). The FIFO 21, the counting circuit 22, the number memory 23, and the timing controller 24 adjust an output timing of the first input signal on which the first pipeline processing has been performed by the A/D converter 12a to match an output timing of the second input signal on which the second pipeline processing has been performed by the A/D converter 12b (step S23). The waveform creation circuit 17 sequentially creates a waveform of the first input signal on which the first pipeline processing has been performed and for which the output timing has been adjusted, and a waveform of the second input signal on which the second pipeline processing has been performed (step S24). The measurement device 10 (10a, 10b) displays the created waveforms of the first and second input signals on the display 18 (step S25). In this way, the measurement device 10 (10a, 10b) can adjust the output timing of the first input signal on which the first pipeline processing has been performed by the A/D converter 12a to match the output timing of the second input signal on which the second pipeline processing has been performed by the A/D converter 12b. Therefore, the waveforms of the output signals of the modules can be compared in real time, even if the maximum sampling rate (maximum sampling period) differs between the A/D converter 12a and the A/D converter 12b.

The measurement device 10a further includes the waveform memory 16 that can store the first input signal on which the first pipeline processing has been performed, and the second input signal on which the second pipeline processing has been performed. The FIFO 21 of the measurement device 10a sequentially stores the first input signal on which the first pipeline processing has been performed by the A/D converter 12a according to the first sample timing. The counting circuit 22 counts the number of times the first sample timing occurs during a period of the second sample timing. According to the second sample timing, the timing controller 24 sequentially reads the first input signal, on which the first pipeline processing has been performed, from the FIFO 21 the number of times counted by the counting circuit 22 and stores the first input signal in the waveform memory 16. Furthermore, according to the second sample timing, the timing controller 24 repeatedly stores the second input signal, on which the second pipeline processing has been performed, in the waveform memory 16 the number of times counted by the counting circuit 22. The waveform creation circuit 17 sequentially creates the waveform of the first input signal and the waveform of the second input signal that are stored in the waveform memory 16. In this way, with the FIFO 21 that sequentially stores the first input signal on which the first pipeline processing has been performed according to the first sample timing, the measurement device 10a adjusts the timing for writing the first input signal, on which the first pipeline processing has been performed, to the memory to match the second pipeline processing. Furthermore, the measurement device 10a counts the number of times the first sample timing occurs during the period of the second sample timing and repeats the process of storing the second input signal, on which the second pipeline processing has been performed, in the waveform memory 16 the number of times counted by the counter. Therefore, since the time shift between the first input signal and the second input signal and the difference in the number of samples are eliminated, the waveforms of the output signals of the modules can be compared in real time.

By using the FIFO 21, the measurement device 10a can also store the first input signal, on which the first pipeline processing has been performed, while maintaining the temporal order.

The measurement device 10b includes the waveform memory 16 that can store the first input signal on which the first pipeline processing has been performed, and the second input signal on which the second pipeline processing has been performed. The first input signal on which the first pipeline processing has been performed by the first processor is stored sequentially in the waveform memory 16 according to the first sample timing. The counting circuit 22 counts the number of times the first sample timing occurs during a period of the second sample timing. According to the second sample timing, the timing controller 24 repeatedly stores the second input signal, on which the second pipeline processing has been performed, in the waveform memory 16 the number of times counted by the counting circuit 22. The waveform creation circuit 17 reads the first input signal on which the first pipeline processing has been performed from the waveform memory 16 after delaying by the counted number of times the first sample timing occurred. Furthermore, in response to storage, in the waveform memory 16, of the second input signal on which the second pipeline processing has been performed, the waveform creation circuit 17 reads the second input signal on which the second pipeline processing has been performed from the waveform memory 16. The waveform creation circuit 17 sequentially creates the waveform of the first input signal read from the waveform memory 16 and the waveform of the second input signal read from the waveform memory 16. In this way, the measurement device 10b counts the number of times the first sample timing occurs during the period of the second sample timing and repeats the process of storing the second input signal, on which the second pipeline processing has been performed, in the waveform memory 16 the number of times counted by the counter. Furthermore, the waveform creation circuit 17 delays the processing to read the first input signal on which the first pipeline processing has been performed from the waveform memory 16 to match the second pipeline processing. Therefore, since the time shift between the first input signal and the second input signal and the difference in the number of samples are eliminated, the waveforms of the output signals of the modules can be compared in real time.

The timing generation circuit 14 generates a first timing signal indicating the first sample timing and a second timing signal indicating the second sample timing based on a sampling signal indicating a sample timing inputted from an external source. The timing generation circuit 14 outputs the first timing signal to the A/D converter 12a and outputs the second timing signal to the A/D converter 12b. The A/D converter 12a performs the first pipeline processing according to the first sample timing indicated by the first timing signal inputted from the timing generation circuit 14. The A/D converter 12b performs the second pipeline processing according to the second sample timing indicated by the second timing signal inputted from the timing generation circuit 14. In this way, the measurement device 10 (10a, 10b) generates the first and second timing signals based on the sampling signal indicating the sample timing inputted from an external source and can thereby perform processing in real time in synchronization with the sampling signal from the external source.

In a case in which the sampling period of the sample timing inputted from the external source is shorter than the maximum sampling period supported by the A/D converter 12b, the timing generation circuit 14 generates the second timing signal so that the second timing signal indicates a sample timing of the maximum sampling period as the second sample timing. In this way, in a case in which the sampling period of the sample timing inputted from an external source is shorter than the maximum sampling period of the A/D converter 12b, the maximum sampling period is used as the second sample timing. Processing can thereby proceed in accordance with the performance of the A/D converter 12b.

A/D conversion processing is included in the first pipeline processing and the second pipeline processing. Therefore, the waveforms of the output signals of the modules can be compared in real time, even if the processing speeds of the A/D converters (12a, 12b) included in the measurement device 10 (10a, 10b) are different.

The present disclosure is not limited to the above embodiments. For example, a plurality of blocks described in the block diagrams may be integrated, or a block may be divided. Instead of a plurality of steps described in the flowcharts being executed in chronological order in accordance with the description, the plurality of steps may be executed in parallel or in a different order according to the processing capability of the apparatus that executes each step, or as required. Other modifications can be made without departing from the spirit of the present disclosure.

The invention claimed is:

1. A measurement device for measuring a waveform of an input signal, the measurement device comprising:
   a first processor configured to perform first pipeline processing on a first input signal according to a first sample timing;
   a second processor configured to perform second pipeline processing on a second input signal according to a second sample timing that has a sampling period longer than the first sample timing;
   an adjustment unit configured to adjust an output timing of the first input signal on which the first pipeline processing has been performed by the first processor to match an output timing of the second input signal on which the second pipeline processing has been performed by the second processor; and
   a creation unit configured to sequentially create a waveform of the first input signal on which the first pipeline processing has been performed and for which the output timing has been adjusted by the adjustment unit, and a waveform of the second input signal on which the second pipeline processing has been performed.

2. The measurement device of claim 1, further comprising:
   a memory configured to store the first input signal on which the first pipeline processing has been performed, and the second input signal on which the second pipeline processing has been performed, wherein
   the adjustment unit comprises
      a storage configured to sequentially store the first input signal on which the first pipeline processing has been performed by the first processor according to the first sample timing;
      a counter configured to count a number of times the first sample timing occurs during a period of the second sample timing; and
      a controller configured to, according to the second sample timing, sequentially read the first input signal, on which the first pipeline processing has been performed, from the storage the number of times counted by the counter and store each first input signal in the memory, and store the second input signal, on which the second pipeline processing has been performed, in the memory the number of times counted by the counter, and
   the creation unit sequentially creates the waveform of the first input signal and the waveform of the second input signal that are stored in the memory.

3. The measurement device of claim 2, wherein the storage includes a FIFO function.

4. The measurement device of claim 1, further comprising:
   a memory configured to store the first input signal on which the first pipeline processing has been performed, and the second input signal on which the second pipeline processing has been performed, wherein
   the first input signal on which the first pipeline processing has been performed by the first processor according to the first sample timing is sequentially stored in the memory,
   the adjustment unit comprises
      a counter configured to count a number of times the first sample timing occurs during a period of the second sample timing; and
      a controller configured to, according to the second sample timing, store the second input signal, on which the second pipeline processing has been performed, in the memory the number of times counted by the counter, and
   the creation unit
      reads the first input signal on which the first pipeline processing has been performed from the memory after delaying by the number of times the first sample timing occurs,
      in response to storage, in the memory, of the second input signal on which the second pipeline processing has been performed, reads the second input signal on which the second pipeline processing has been performed from the memory, and
      sequentially creates the waveform of the first input signal read from the memory and the waveform of the second input signal read from the memory.

5. The measurement device of claim 1, further comprising:
   a timing generator configured to generate a first timing signal indicating the first sample timing and a second timing signal indicating the second sample timing based on a sampling signal indicating a sample timing inputted from an external source, output the first timing signal to the first processor, and output the second timing signal to the second processor, wherein
   the first processor performs the first pipeline processing according to the first sample timing indicated by the first timing signal inputted from the timing generator, and
   the second processor performs the second pipeline processing according to the second sample timing indicated by the second timing signal inputted from the timing generator.

6. The measurement device of claim 5, wherein in a case in which a sampling period of the sample timing inputted from the external source is shorter than a maximum sampling period supported by the second processor, the timing generator generates the second timing signal so that the second timing signal indicates a sample timing of the maximum sampling period as the second sample timing.

7. The measurement device of claim 1, wherein A/D conversion processing is included in the first pipeline processing and the second pipeline processing.

8. A measurement method of a measurement device for measuring a waveform of an input signal, the measurement method comprising:
- performing, by a first processor, first pipeline processing on a first input signal according to a first sample timing;
- performing, by a second processor, second pipeline processing on a second input signal according to a second sample timing that has a sampling period longer than the first sample timing;
- adjusting, by an adjustment unit, an output timing of the first input signal on which the first pipeline processing has been performed by the first processor to match an output timing of the second input signal on which the second pipeline processing has been performed by the second processor; and
- sequentially creating, by a creation unit, a waveform of the first input signal on which the first pipeline processing has been performed and for which the output timing has been adjusted by the adjustment unit, and a waveform of the second input signal on which the second pipeline processing has been performed.

* * * * *